US010113112B2

(12) United States Patent
Coropceanu et al.

(10) Patent No.: US 10,113,112 B2
(45) Date of Patent: Oct. 30, 2018

(54) PREPARATION OF NANORODS

(71) Applicant: Massachusetts Institute of Technology, Cambridge, MA (US)

(72) Inventors: Igor Coropceanu, Cambridge, MA (US); Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/201,365

(22) Filed: Jul. 1, 2016

(65) Prior Publication Data

US 2017/0002266 A1 Jan. 5, 2017

Related U.S. Application Data

(60) Provisional application No. 62/188,177, filed on Jul. 2, 2015.

(51) Int. Cl.
| | | |
|---|---|---|
| *C30B 29/62* | (2006.01) | |
| *C09K 11/88* | (2006.01) | |
| *C30B 7/00* | (2006.01) | |
| *C30B 7/14* | (2006.01) | |
| *C30B 29/48* | (2006.01) | |
| *C30B 29/50* | (2006.01) | |
| *C30B 29/60* | (2006.01) | |
| *B82Y 40/00* | (2011.01) | |
| *B82Y 20/00* | (2011.01) | |
| *B82Y 30/00* | (2011.01) | |

(52) U.S. Cl.
CPC ............ *C09K 11/883* (2013.01); *C30B 7/005* (2013.01); *C30B 7/14* (2013.01); *C30B 29/48* (2013.01); *C30B 29/50* (2013.01); *C30B 29/60* (2013.01); *B82Y 20/00* (2013.01); *B82Y 30/00* (2013.01); *B82Y 40/00* (2013.01); *Y10S 977/762* (2013.01); *Y10S 977/892* (2013.01); *Y10S 977/896* (2013.01); *Y10S 977/95* (2013.01)

(58) Field of Classification Search
CPC .......... C30B 29/62; C30B 29/602; C30B 7/00
See application file for complete search history.

(56) References Cited

U.S. PATENT DOCUMENTS

| | | | | |
|---|---|---|---|---|
| 7,534,488 B2 * | 5/2009 | Alivisatos | ............... | B82Y 15/00 428/402 |
| 7,767,260 B2 | 8/2010 | Peng et al. | | |
| 8,956,637 B2 * | 2/2015 | Dubrow | .................. | A61F 13/02 424/422 |
| 9,349,806 B2 * | 5/2016 | Ho | .......................... | H01L 29/24 |
| 2005/0266246 A1 | 12/2005 | Reiss et al. | | |
| 2008/0012876 A1 * | 1/2008 | Fejfar | ................. | B41F 33/0036 345/589 |

(Continued)

OTHER PUBLICATIONS

International Search Report dated Sep. 14, 2016, issued in International Application No. PCT/US2016/040882.

(Continued)

*Primary Examiner* — Robert M Kunemund
(74) *Attorney, Agent, or Firm* — Steptoe & Johnson LLP

(57) ABSTRACT

A method of preparing a core-shell nanorod can include growing a shell of a core-shell nanorod (M1X1)M2X2 in a solution through a slow-injection of M2 precursor solution and X2 precursor solution, wherein the core-shell nanorod includes a M1X1 core.

13 Claims, 14 Drawing Sheets

(56) References Cited

U.S. PATENT DOCUMENTS

2013/0240787 A1  9/2013  Chen et al.
2014/0255604 A1  9/2014  Hens et al.

OTHER PUBLICATIONS

The Written Opinion of the International Searching Authority dated Sep. 14, 2016, issued in International Application No. PCT/US2016/040882.

Coropceanu et al., Core/Shell Quantum Dot Based Luminescent Solar Concentrators with Reduced Reabsorption and Enhanced Efficiency, Nano Letters, vol. 14, Jun. 6, 2014, pp. 4097-4101.

Notification of Transmittal of the International Search Report and the Written Opinion of the International Searching Authority dated Sep. 14, 2016, issued in International Application No. PCT/US2016/040882.

* cited by examiner c

PREPARATION OF NANORODS

CLAIM OF PRIORITY

This application claims priority to U.S. Provisional Application No. 62/188,177, filed Jul. 2, 2015, which is incorporated by reference in its entirety.

BACKGROUND

Nanostructures frequently exhibit properties different from the corresponding bulk material. Changes in properties can be influenced by shape and size of the nanostructure. This is especially true for nanostructures having large aspect ratios, such as nanorods, which can differ quite significantly in diameter and length.

SUMMARY

A method of preparing a core-shell nanorod can include growing a shell of a core-shell nanorod (M1X1)M2X2 in a solution through a slow-injection of M2 precursor solution and X2 precursor solution to a suspension of M1X1 nanocrystals, wherein the core-shell nanorod includes a M1X1 core.

The core nanocrystal can include CdSe. The shell can include CdS. The solution can include an acid. The solution can include an amine.

In certain embodiments, the method can include degassing the solution. The method can include growing the core-shell nanorod at a temperature of no higher than 310° C. The slow-injection rate of M2 precursor can be less than 0.4 mmol per hour. The slow-injection rate of X2 precursor can be less than 0.4 mmol per hour. The M2 precursor solution can include 1-octadecene. The X2 precursor solution can include 1-octadecene. Concentration of the M2 precursor can be between 0.05 M-0.20 M. Concentration of the X2 precursor can be between 0.07 M and 0.30 M.

Other aspects, embodiments, and features will be apparent from the following description, the drawings, and the claims.

DETAILED DESCRIPTION

Figure 1A:
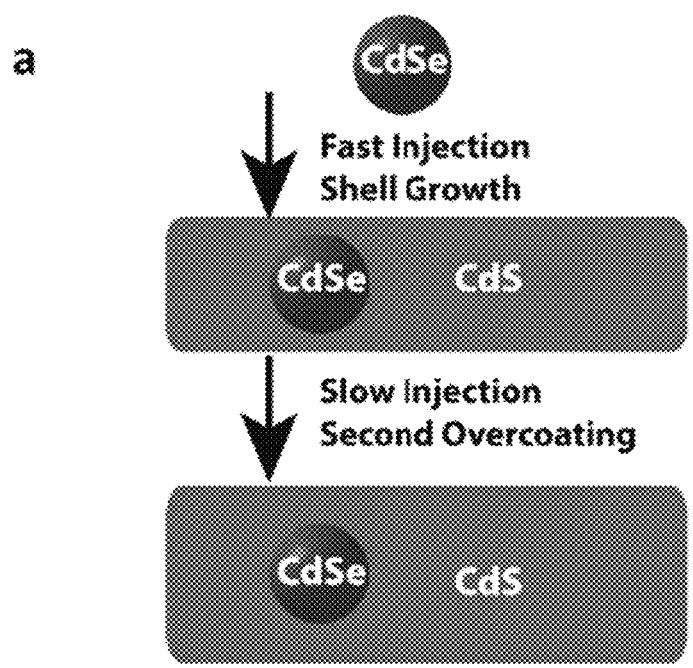
FIG. 1A shows the general synthetic scheme for the synthesis of the seeded nanorods.
Figure 1B:
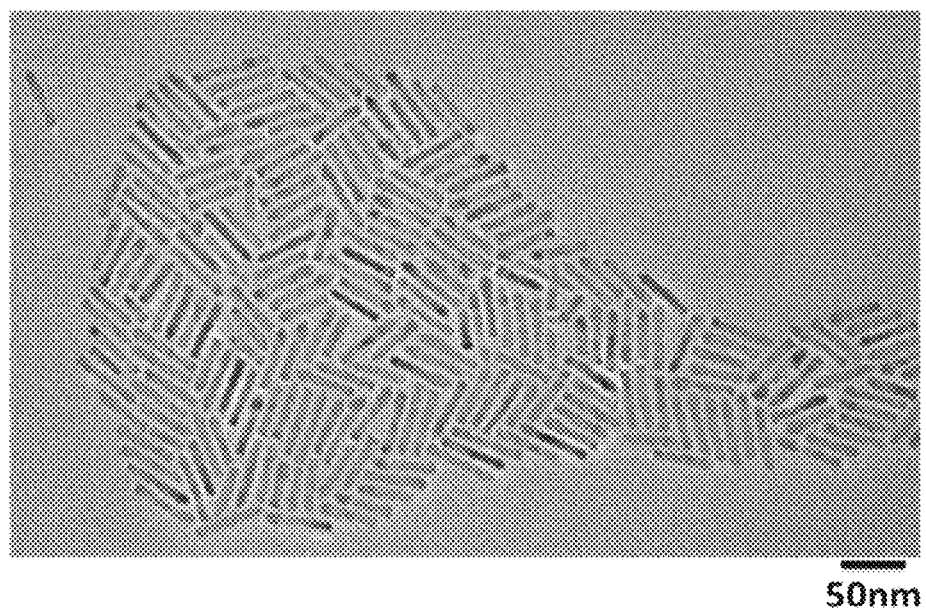
FIG. 1B shows TEM micrograph after growth of second shell S1.

A two-step process can be used for growing the shell of core/shell nanorods, such as CdSe/CdS. The method combines a fast-injection based step to create the initial elongated shell with a second slow-injection growth that allows for a systematic variation of the shell thickness while maintaining a high degree of monodispersity at the batch level and enhancing the uniformity at the single nanorod level. One benefit of this two-step approach was to increase the fluorescence quantum efficiency of the nanorods up to 100%. In addition, the nanorods also exhibited effectively complete energy transfer from the shell to the core, which made the quantum yield insensitive to the energy of the excitation source. The improvement in the quantum yield was accompanied by the suppression of a defect band, ubiquitous to CdSe based nanocrystals after the second growth.

A method of preparing a core-shell nanorod can include growing a shell of a core-shell nanorod (M1X1)M2X2 in a solution through a slow-injection of M2 precursor solution and X2 precursor solution to a suspension of M1X1 nanocrystals, wherein the core-shell nanorod includes a M1X1 core. Each of M1 and M2, independently, can be Zn, Cd, Mg, Hg, Al, Ga, In, Tl, or Pb. Each of X1 and X2, independently, can be O, S, Se, Te, N, P, As, or Sb. M1X1 can be CdSe, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. M2X2 can be ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. The nanorods can have a diameter of less than 10 nm and a length of greater than 20 nm, greater than 30 nm, greater than 40 nm or greater than 50 nm. The length can be less than 100 nm.

The versatility of inorganic nanocrystals is greatly expanded by the possibility of modifying their electronic properties by changing not only their size, but also their dimensionality. In particular, elongated structures such as nanorods exhibit an attractive set of emergent properties that set them apart from spherical quantum dots, such as a large degree of fluorescence anisotropy and enhanced transport through various types of biological tissue. See, for example, Carbone, L. et al., *Nano Lett.* 2007, 7, (10), 2942-2950; Talapin, D. V. et al., *Nano Lett.* 2003, 3, (12), 1677-1681; Chauhan, V. P. et al., *Angewandte Chemie International Edition* 2011, 50, (48), 11417-11420, each of which is incorporated by reference in its entirety. Among visible-light emitting materials, seeded CdSe/CdS nanorods (structures consisting of a spherical CdSe core surrounded by an elongated CdS shell) have emerged as a robust material system combining a high degree of monodispersity with bright and spectrally narrow photoluminescence. However, while rapid initial progress in the development of CdSe/CdS nanorods resulted in the achievement of fluorescence quantum yields of up to 75%, further improvement of the quantum yield proved elusive. See, for example, Sitt, A. et al., *Nano Today* 2013, 8, (5), 494-513, which is incorporated by reference in its entirety. Moreover, as with CdSe/CdS quantum dots, the quantum yield was rapidly observed to decrease with increasing shell volume, an effect which was attributed to the long radiative lifetimes caused by delocalization of the electron into the shell. This reduction in the efficiency has been a significant barrier to these materials for a variety of optical and optoelectronic applications, such as luminescent solar concentrators (LSCs), which require both a high quantum yield and a large shell volume in order to minimize reabsorption. See, for example, Coropceanu, I. et al., *Nano Lett.* 2014, 14, (7), 4097-4101; Bronstein, N. D. et al., *ACS Nano* 2014, 8, (1), 44-53; Bradshaw, L. R. et al., *Nano Lett.* 2015, 15, (2), 1315-1323, each of which is incorporated by reference in its entirety. A two-step process can be used to synthesize the shell by first using a hot injection reaction to grow a thin CdS shell, followed by a slow second growth. This combined approach resulted in the synthesis of highly monodisperse samples with tunable shell dimensions, highly suppressed defect emission, and fluorescence quantum efficiencies up to 100%.

The general synthetic scheme for the shell growth is illustrated in FIG. 1A. Spherical CdSe cores were first overcoated using a fast injection-based recipe to yield thin-shelled CdSe/CdS nanorods with a high degree of monodispersity. These nanorods were then isolated and in a second reaction the shell was grown further using a high-temperature, slow-injection reaction. The second growth provided two key advantages: 1) an increase in the fluorescence quantum yield and a suppression of the trap emission and 2) independent control of the shell thickness. This synthetic protocol resulted in nanorods that remained very monodisperse at the batch level even as the shell thickness was continuously increased.

A two-step method can be used to grow an elongated CdS shell on CdSe cores, yielding highly monodisperse nanorods with tunable shell thickness and near unity quantum yields. The nanorods also exhibited highly efficient energy transfer from the shell to the core, making the structures well-suited for broadband light harvesting. The improvement in the optical properties of the system may be attributed to the increased uniformity and crystallinity of the shell made by possible by the long reaction time of the second growth. This can also be used for spherical giant-shelled CdSe/CdS particles to a quasi-one dimensional geometry where the good optical properties can be combined with linear polarization. These new materials can be good candidates for a variety of optical applications such as luminescent down-shifting and luminescent solar concentrators. See, for example, Meinardi, F. et al., Nat Photon 2014, 8, (5), 392-399, which is incorporated by reference in its entirety.

A method of preparing a core-shell nanorod can include growing a shell of a core-shell nanorod (M1X1)M2X2 in a solution through a slow-injection of M2 precursor solution and X2 precursor solution to a suspension of M1X1 nanocrystals, wherein the core-shell nanorod includes a M1X1 core. The growth can occur in two steps, first at a temperature of between about 350-380° C. then at a second temperature of about 310° C. The slow-injection rate of M2 precursor can be less than 0.4 mmol per hour; the slow-injection rate of M2 precursor can be less than 0.2 mmol per hour; the slow-injection rate of M2 precursor can be less than 0.1 mmol per hour. The slow-injection rate of X2 precursor can be less than 0.4 mmol per hour; the slow-injection rate of X2 precursor can be less than 0.2 mmol per hour; the slow-injection rate of X2 precursor can be less than 0.1 mmol per hour. The growth can occur in two steps, first at a temperature of 350° C.-380° C. and then at 310° C. The second temperature can also be less than 310° C. The concentration of the M2 precursor can be between 0.05 M-0.20 M. The concentration of the X2 precursor is between 0.07 M-0.30 M.

Example

Synthesis of Thick-Shelled CdSe/CdS Nanorods

Initial Nanorod Growth:

The initial seeded nanorods were prepared by following the procedure reported by Carbone et al, *Nano Lett.* 2007, 7, (10), 2942-2950, which is incorporated by reference in its entirety, using CdSe cores with a maximum of the first excitonic feature in the absorbance spectrum at 585 nm. The nanorods after this step had approximately a length of 44 nm and a thickness of 4.5 nm.

Second Slow Growth:

To a 250 mL round bottom flask was added 40 nmol of the initial CdSe/CdS cores nanorods dissolved in hexane, 3 mL of ODE, 3 mL of oleylamine, and 3 mL of oleic acid. The solution was degassed at r.t. for 1 hr. and then for 20 min at 100° C. to remove the hexane and water. The solution was then stirred under $N_2$ and the temperature was raised to 310° C. At 200° C., a solution of Cd-oleate (2 mL of a 0.2M solution of Cd-oleate in ODE) dissolved in ODE and a separate solution of octanethiol (84 μL) dissolved in ODE (for a total volume of 6 mL for each) were injected at a rate of 3 mL/hr. The final solution was then cooled down and the nanorods were collected by precipitation using acetone followed by re-dispersion in hexane. At this stage the nanorods had a length of 45 nm and a thickness of 6.7 nm.

Figure 1C:
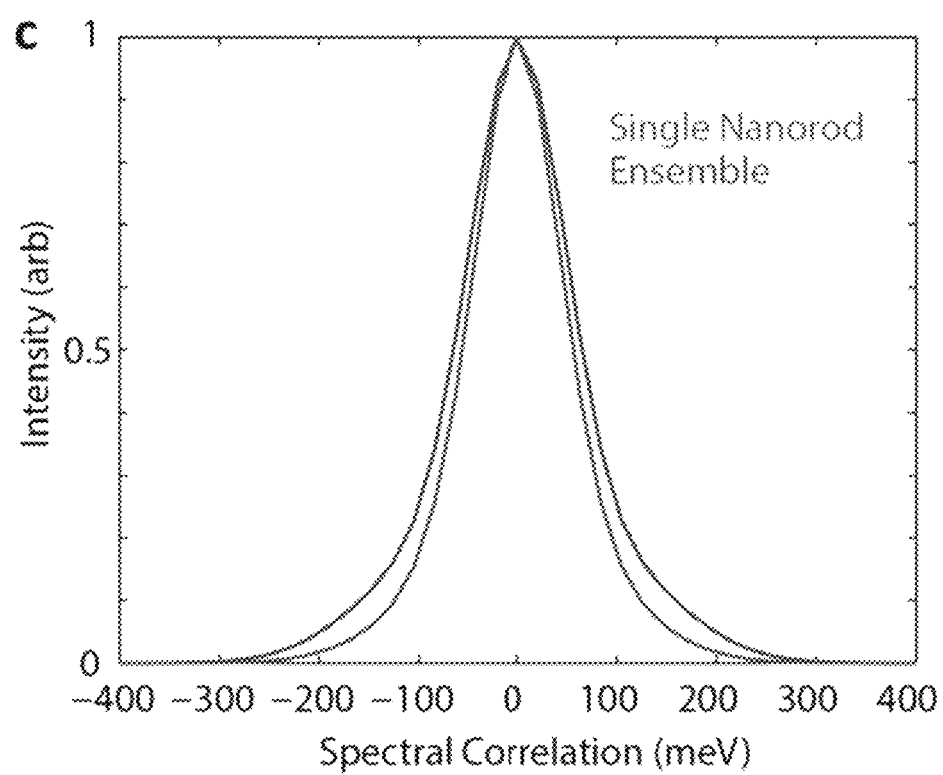
FIG. 1C shows s-PCFS traces showing the ensemble and average single nanorod spectral correlation of sample S1.
Figure 1D:
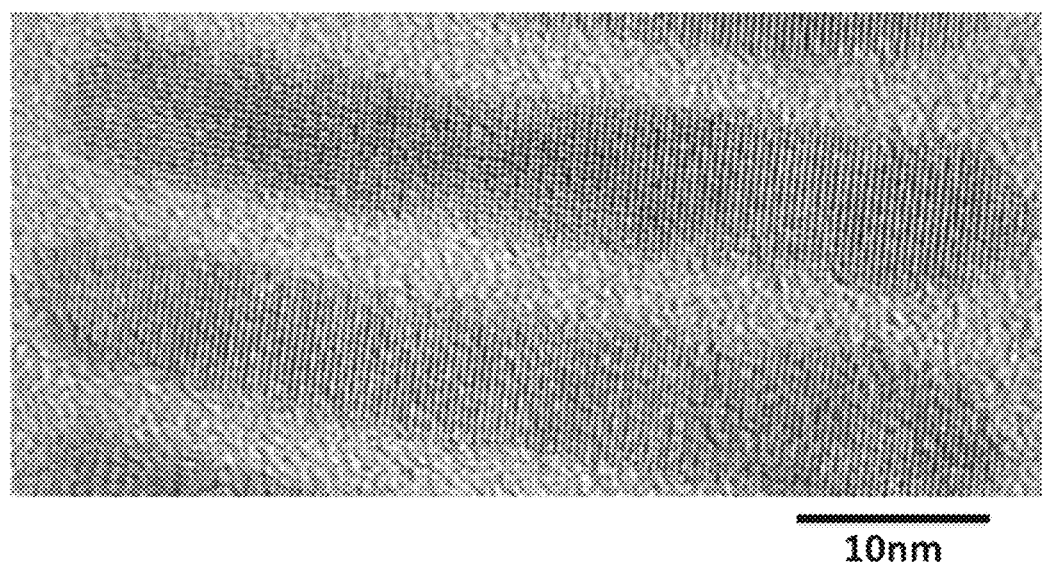
FIG. 1D shows HRTEM of sample S2.

In order to study the effective monodiperisty of the sample as it relates to the optical properties of the system, the ensemble and average single nanorod spectral correlations were measured using solution-Photon Correlation Fourier Spectroscopy (s-PCFS, see FIG. 1C). See, for example, Cui, J. et al., *Nature Chem.* 2013, 5, (7), 602-606, which is incorporated by reference in its entirety. From the small difference between the two spectral correlations, one can readily conclude that the inhomogeneous broadening of the sample only results in a minor contribution to the overall spectral width. In addition, the particles were highly uniform and crystalline at the individual nanorod level as can be seen from the high resolution TEM in FIG. 1D. The uniformity achieved after the second growth step appears to be a significant improvement from the initial nanorods, where the fast injection frequently results in the appearance of visible kinks as well as other crystallographic defects such as edge dislocations.

In order to systematically study the evolution of the electronic and optical properties of the new nanorods, a size series was prepared by first creating a batch of nanorods using the conventional fast-injection based growth (denoted F1), which was then subjected to one or two additional slow growth steps to create three new samples, which was denoted in the order of increasing thickness as S1, S2, and S3. As can be seen from table 1, while the length of all the four samples is almost unchanged, the thickness varies from 5.4 nm for F1 to 6.1, 7.1, and 8.1 in S1, S2, and S3 respectively. By taking into account the initial size of the core (~4 nm) and the thickness of each individual CdS layer, the change in the number of CdS monolayers can be estimated to be from 2 in S1 to 4, 5, and 6 respectively in S1, S2, and S3.

TABLE 1

Dimensions and Fluorescence Quantum Efficiency of Nanorod Samples

| Sample | Height (nm) | Width (nm) | Quantum Yield (%) |
| --- | --- | --- | --- |
| F1 | 45 | 5.4 | 59 ± 1% |
| S1 | 48 | 6.1 | 95 ± 1% |
| S2 | 49 | 7.1 | 98 ± 2% |
| S3 | 50 | 8.1 | 85 ± 1% |

Characterization of Core-Shell Nanorods

Absorption spectra were recorded using a Cary 5000 spectrophotometer and emission spectra were recorded using a Fluoromax-3 spectrofluorometer. Quantum yield measurements were taken using a Labsphere integrating sphere using a 5 mW, 405 nm as the source, chopping the beam at 210 Hz and collecting the output using a calibrated silicon detector through a Stanford Research Systems lock-in amplifying system. The polarization dependent studies were carried out using 488 nm light from an Argon Ion laser as the excitation source and a PI-MAX3 ICCD as the detector.

Figure 2A:
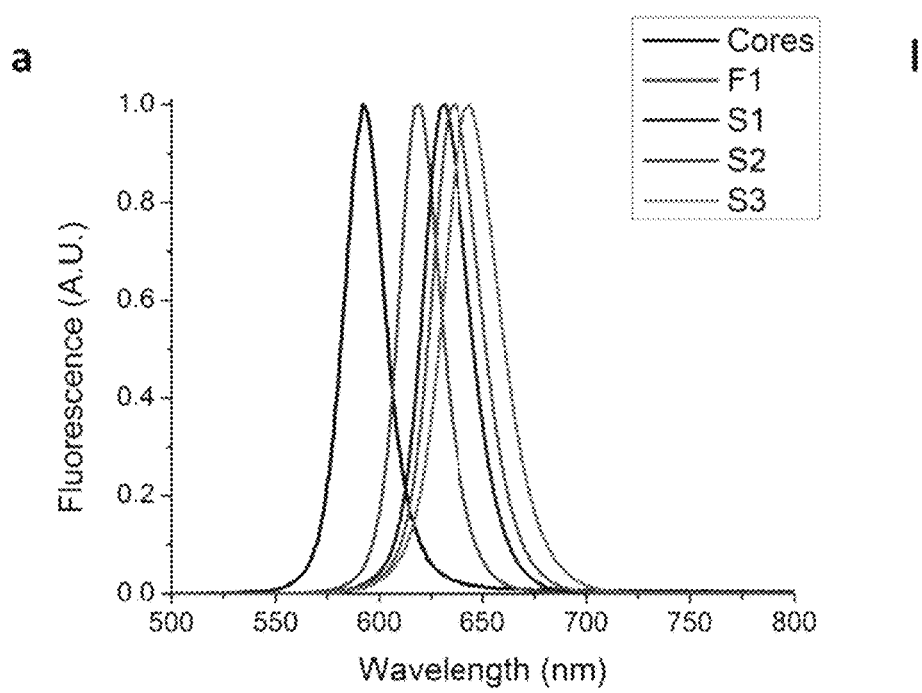
FIG. 2A shows fluorescence spectra of the CdSe cores and the nanorods on a linear scale.
Figure 2B:
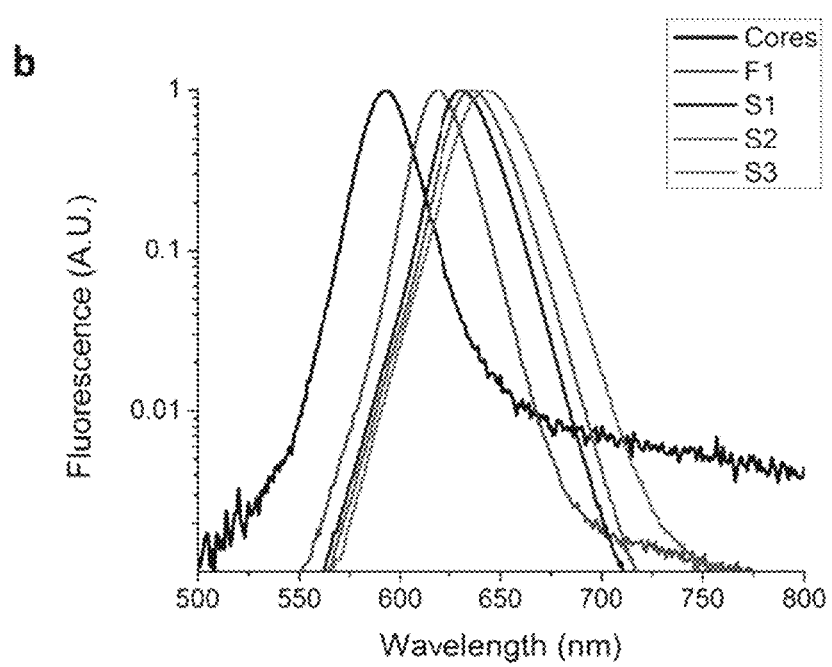
FIG. 2B shows fluorescence spectra on a logarithmic scale.

The fluorescence spectra of these samples are shown in FIG. 2A. As the shell volume was increased the spectra continuously redshifted and the lineshapes slightly broadened as expected from the known tendency of the electron to delocalize into the shell across the quasi type-II barrier typical of CdSe/CdS heterostructures. An interesting qualitative difference between the spectra is revealed when re-plotting the data on a logarithmic scale (FIG. 2b). In addition to the band-edge luminescence, one can distinguish an additional red-shifted band in some of the spectra. Such a feature is ubiquitous to CdSe or CdS based nanoparticles and while its origin has not been definitively identified, it is generally attributed to defect states either at the surface of the nanoparticle or at the core/shell interface and is for this reason usually denoted as the trap band in these materials. See, for example, Kambhampati, P., *Chem. Phys.* 2015, 446, (0), 92-107, which is incorporated by reference in its entirety. What is interesting is that while this feature is strongly pronounced in the initial CdSe cores and still clearly apparent in the initial nanorods, this band is highly suppressed in the samples subjected to the second slow shell growth. Indeed the feature is essentially undetectable in the two thinner nanorod samples (S1 and S2) and only re-emerged in the thickest sample (S3), but even then remained much weaker than in the initial nanorods. It is possible that the reduction of the defect band is in part due to the large degree of uniformity and crystallinity of the shell and a better passivation of the surface.

The fluorescence quantum yield of the four nanorod samples were then measured using an integrating sphere (see Table 1). The excitation wavelength was selected to be 405 nm in order to ensure that the majority of the absorption occurred directly into the shell. The initial quantum yield of the nanorods after the first growth was only moderate at 60%, which already represented a reduction from the higher values (70%+) measured for nanorods made from the same batch of cores but having a shorter shell. Upon growing a thin shell using the slow growth method (sample S1), the quantum yield increased to 90%. A similar sample having a thicker shell (S2) was measured to have a quantum yield of 100%. This significant increase in the quantum yield even as the shell volume was increased, suggests a strong suppression of the non-radiative decay channels present in the initial nanorods. It was only when growing the shell further that the quantum yield decreased, a value of 90% being measured for the thickest-shelled nanorods in this series. This final decrease in the quantum yield may largely be due to the gradual lengthening of the radiative lifetime as the shell volume was increased (see FIG. 2D), which again made the remaining non-radiative decay channels competitive with radiative recombination.

Figure 2C:
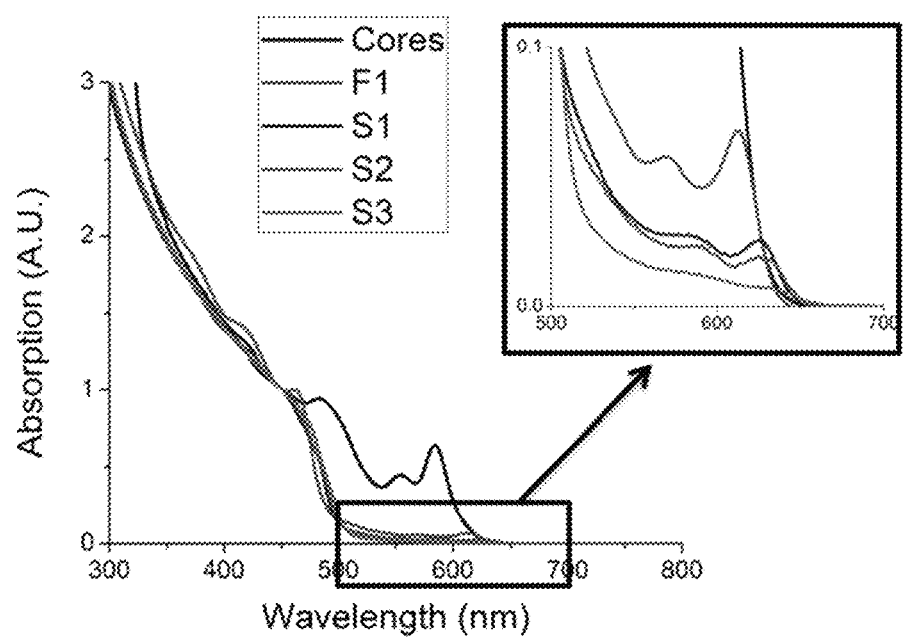
FIG. 2C shows absorption spectra of nanorods (inset magnification of first excitonic feature)
Figure 2D:
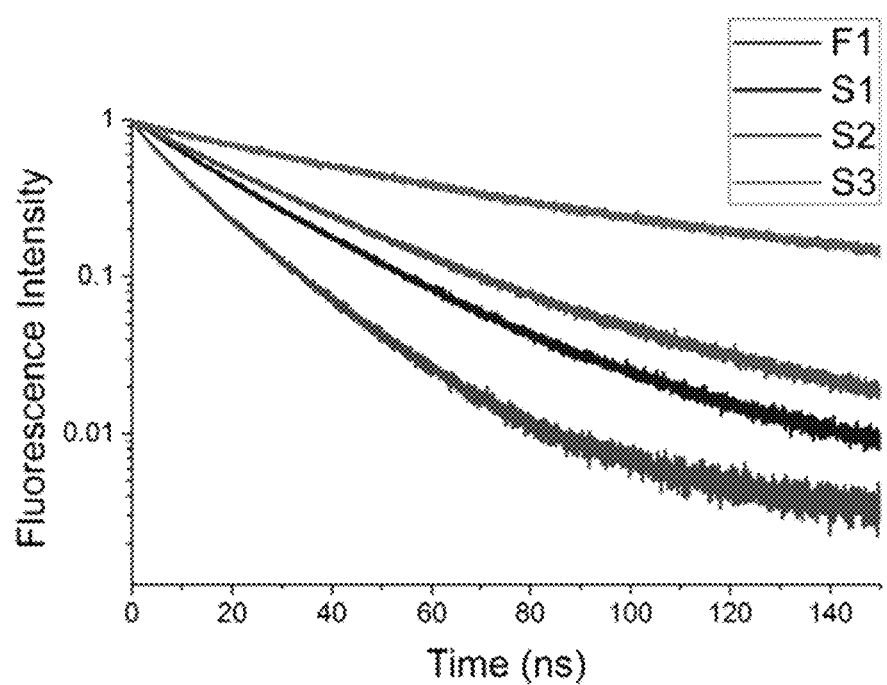
FIG. 2D shows time resolved photoluminescence traces of the nanorod samples.

The evolution of the normalized absorption spectra from the CdSe cores to the nanorod series is shown in FIG. 2C. At high energies (above 500 nm), where most of the absorption is mediated by the CdS shell, the spectra remain relatively constant, barring the gradual disappearance of the sharp features as the CdS shell gradually transitions from the quasi-one dimensional confinement to its bulk-like limit. However, as in the case of spherical CdSe/CdS quantum dots, the biggest change observed in the spectra consists in the relative reduction of the first excitonic features (see the inset of FIG. 2C) compared to the CdS band as the volume of the shell increases and consequently the volumetric ratio of CdSe to CdS decreases. Because virtually all of the spectral overlap between the emission and absorption spectra of the nanorods occurs through this first excitonic feature, its relative reduction directly leads to a decrease in the effective reabsorption of these materials. Indeed, for the sample with the largest shell volume (S3), the absorption at the fluorescence maximum is reduced by two orders of magnitude compared to its value in the CdS band. Such a low reabsorption is comparable to values previously reported for giant-shelled CdSe/CdS quantum dots and represents one of the lowest levels of reabsorption measured in inorganic or organic materials.

One additional advantage of dividing the shell growth in two steps is to allow for an independent control of the length and thickness of the nanorods, allowing for the synthesis of uniform particles with a wide range of aspect ratios for any particular length. The shell thickness can be increased by adding additional precursors during the second growth. The length width aspect ratio of the nanorod can be between 1 and 20. While conventional fast growth techniques yield highly uniform particles with a tunable length, changing the thickness has proven to be much more challenging since varying most synthetic parameters such as the amount of precursors injected and the reaction time predominantly affects the length while leaving the thickness largely unchanged. While some progress has been reported and preparing thicker shelled nanorods by using a higher injection temperature, this approach nevertheless still resulted in coupled growth of the nanorods along both their long and short axes. See, for example, Pisanello, F. et al., *Adv. Mater.* (Weinheim, Ger.) 2013, 25, (14), 1974-1980, which is incorporated by reference in its entirety. In contrast, using our method, because the first step results predominantly in growth along the long axis, while the second step results in a uniform growth in all directions, it becomes possible to separately vary each of the dimensions, making it simple to synthesize nanorods with the desired combination of length and thickness.

Figure 3A:
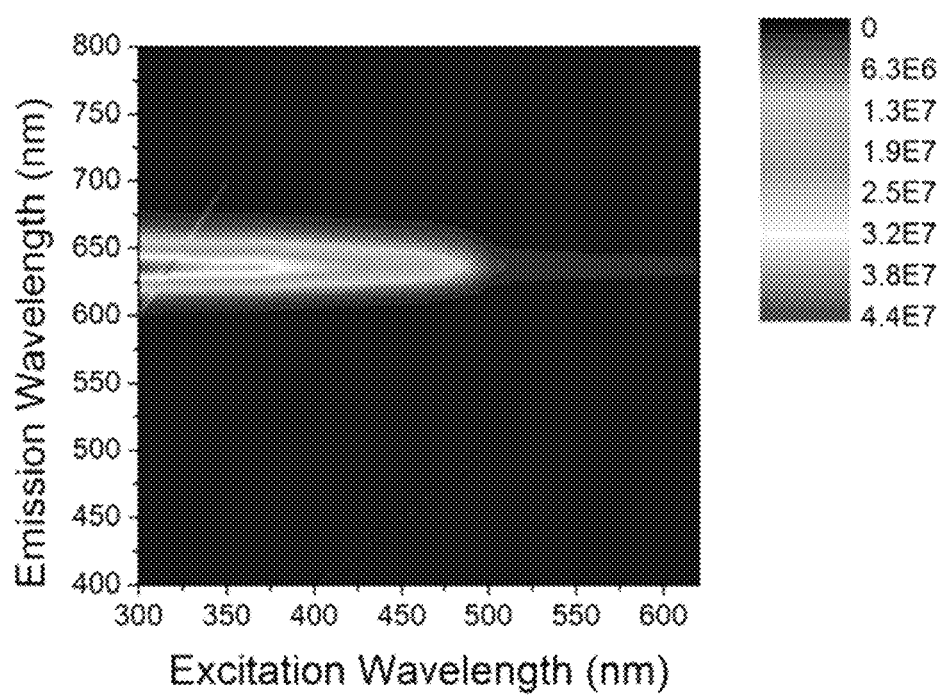
FIG. 3A shows excitation-emission spectrum of CdSe/CdS nanorods.
Figure 3B:
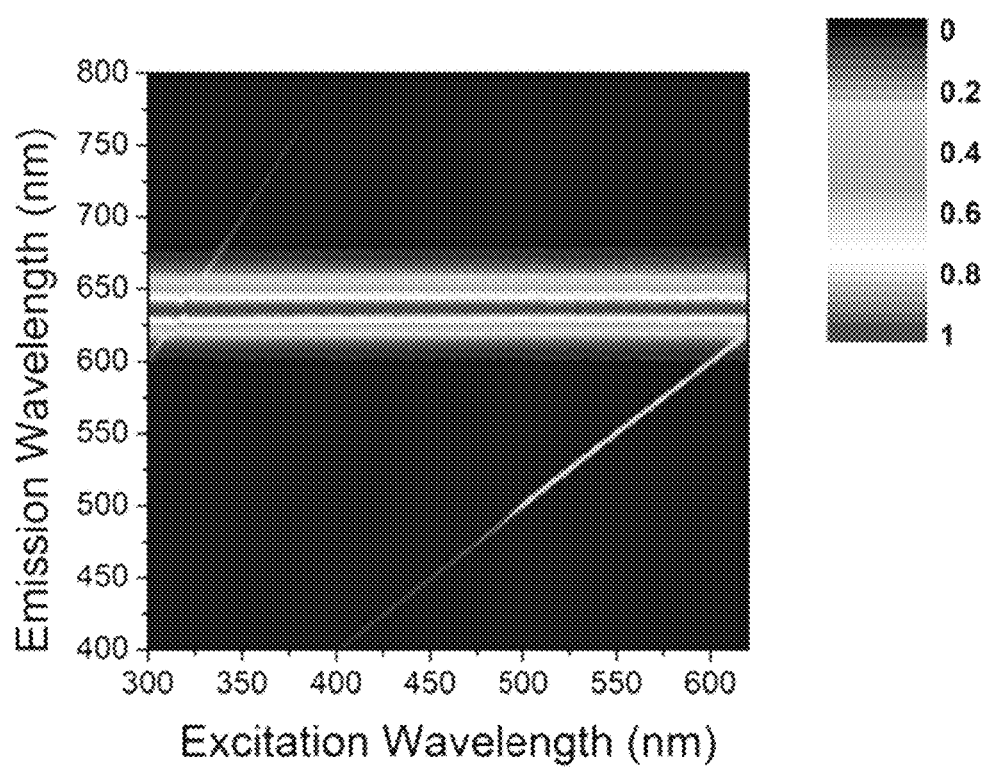
FIG. 3B shows normalized excitation-emission spectrum of CdSe/CdS nanorods.
Figure 3C:
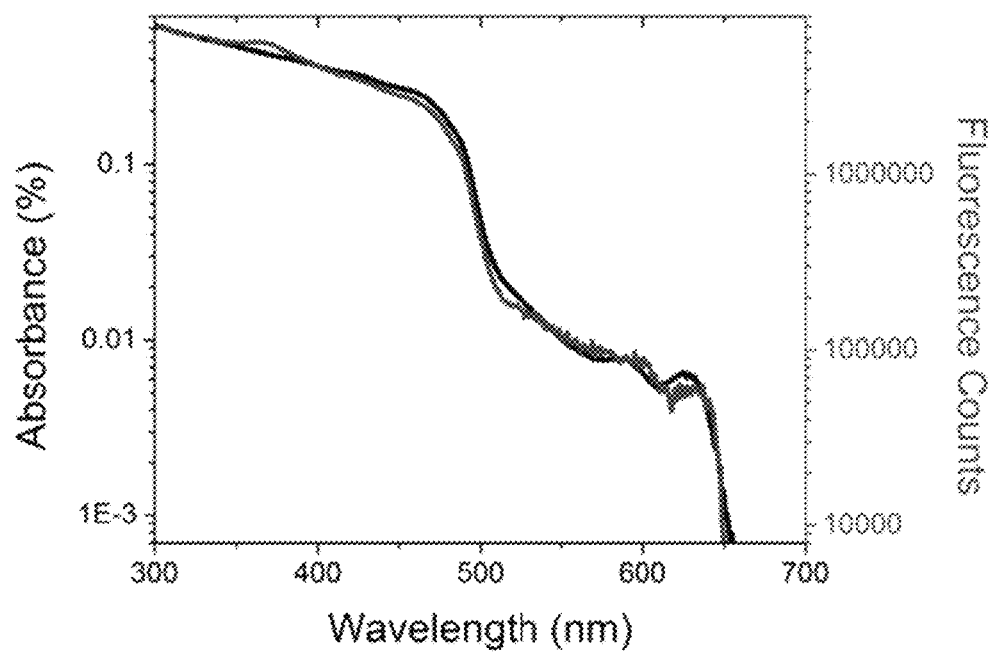
FIG. 3C shows excitation spectrum and absorbance of CdSe/CdS nanorods.
Figure 3D:
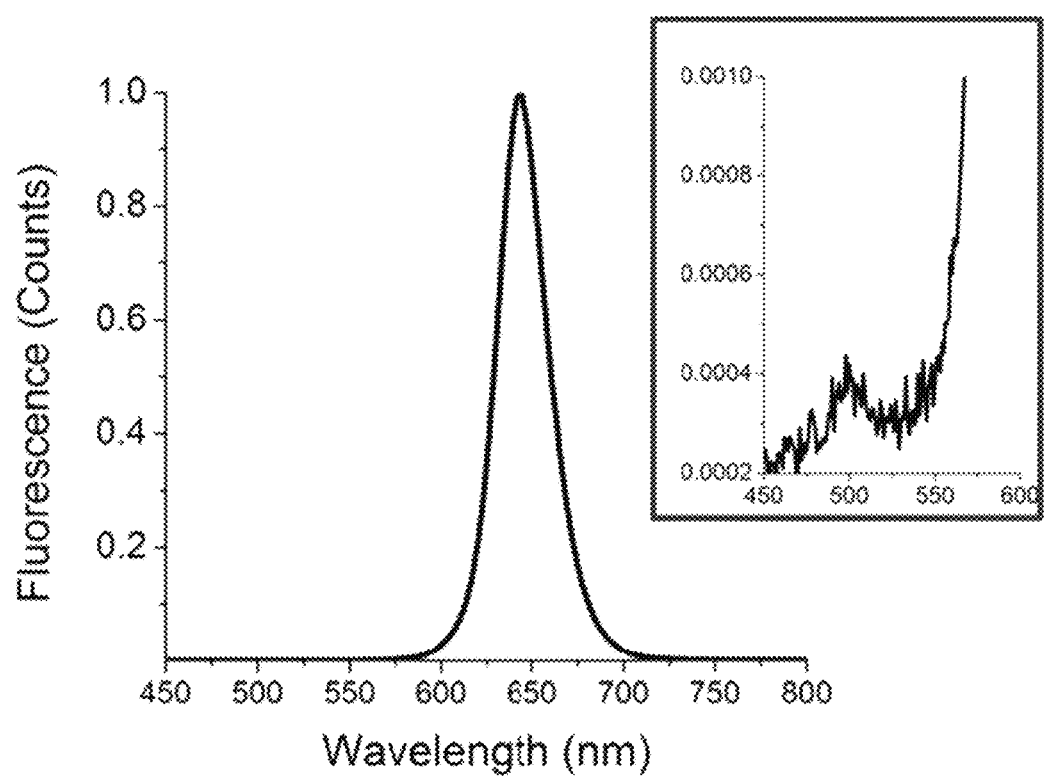
FIG. 3D shows photoluminescence of CdSe/CdS nanorods (inset magnification ×1000).

One key property exhibited by the nanorods grown using the current method is that in contrast to other large volume CdSe/CdS particles, they exhibit effectively complete energy transfer from the shell to the core. Such a result could be anticipated from the fact that a unity quantum yield was measured even when exciting at 405 nm, where most of the absorption occurred directly into the shell. A more systematic demonstration of this property follows from the analysis of the excitation-emission spectrum of the nanorods, shown in FIG. 3B, which shows the variation of the fluorescence spectrum of the nanorods as a function of the excitation wavelength. Upon normalizing the spectrum to the peak of the fluorescence at each excitation wavelength (FIG. 3B), it is apparent that the spectrum remains completely unchanged, suggesting that the exciton is always able to equilibrate on a time scale much faster than the fluorescence lifetime. Upon taking a cross-section of the 2D plot prior to normalization (or equivalently directly measuring an excitation spectrum), the resulting spectrum tracks the absorbance spectrum completely. This behavior indicates that excitation at any wavelength if absorbed is equally likely to ultimately result in radiative recombination. The reason that the energy transfer in these nanorods is significantly more efficient than in conventional nanorods of similar dimensions may be due to the higher uniformity of the shell, which results in a suppression of the surface traps that may otherwise prevent the exciton from localizing to the core. See, for example, Wu, K. et al., *ACS Nano* 2015, which is incorporated by reference in its entirety. It should be pointed out that upon magnifying the spectral range around 500 nm, one can observe a very small peak as shown in the inset of FIG. 3D, presumably due to emission of light from the CdS shell prior to thermalization. The integrated area of this feature is about 10,000 weaker than the integrated band-edge spectrum, which is consistent with the fact that the typical carrier localization timescale (~40 ps) is about 1000-10000 times shorter than the typical intrinsic radiative lifetime of CdS nanostructures (~10 ns).

Figure 4A:
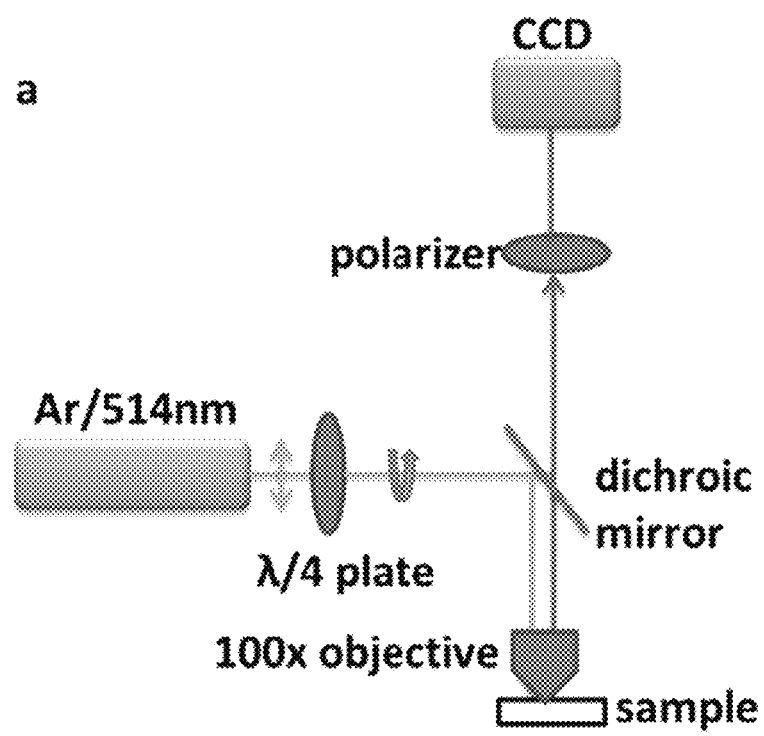
FIG. 4A shows schematic of the set-up used for polarization dependent single nanorod fluorescence spectroscopy.
Figure 4B:
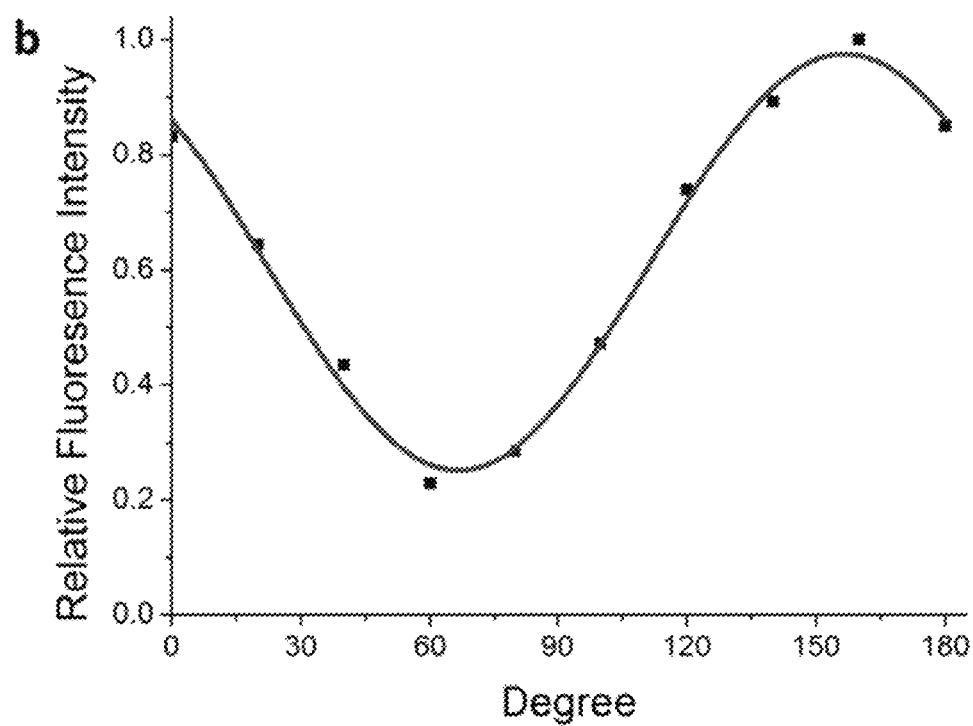
FIG. 4B shows fluorescence intensity of sample T1 as a function of the polarizer angle

Finally, in order to assess the degree of polarization of the nanorods, polarization-dependent single particle fluorescence spectroscopy was performed. It would be interesting to see whether the thickest shell nanorods would exhibit the same degree of polarization (P., defined as the difference of the orthogonally polarized components of the fluorescence divided by the total fluorescence intensity) as the conventional, thinner nanorods obtained after the initial first injection. The experimental set-up that was used is shown schematically in FIG. 4A (a detailed description of the experiment is described in the supplementary information). The sample consisted of a dilute solution of nanorods spun cast onto a coverslip, which allowed for a clear separation between individual particles. The nanorods had a length of 63 nm and a thickness of 10 nm, resulting in an aspect ratio (the ratio of the length to the width) of approximately 6. A typical trace showing variation of the fluorescence intensity as a function of the polarizer angle is shown in FIG. 4B, from which the degree of polarization can be estimated to be ~65%. This value is comparable to values that have been previously reported for nanorods that had a similar aspect ratio, but with a thinner shell (and a proportionately shorter length). Such a result is consistent with the theoretically predicted component of the fluorescence polarization that is attributable to the dielectric environment, as this contribution should only depend on the aspect ratio rather on the ratio of the length and the width of the shell, rather on their absolute dimensions. See, for example, Shabaev, A. et al., *Nano Lett.* 2004, 4, (10), 1821-1825, which is incorporated by reference in its entirety.

Other embodiments are within the scope of the following claims.

What is claimed is:

1. A method of preparing a core-shell nanorod comprising growing a shell of a core-shell nanorod (M1X1)M2X2 in a solution through a slow-injection of M2 precursor solution and X2 precursor solution to a suspension of M1X1 nanocrystals to form the shell in a first shell growth step, and, after stopping the first shell growth step, further growing the shell of the core-shell nanorod (M1X1)M2X2 in the solution through a slow-injection of M2 precursor solution and X2 precursor solution to a suspension of M1X1 nanocrystals to form a thicker shell in a second shell growth step and, wherein the core-shell nanorod includes a M1X1 core.

2. The method of claim 1, wherein the core nanocrystal includes CdSe.

3. The method of claim 1, wherein the shell includes CdS.

4. The method of claim 1, wherein the solution includes an acid.

5. The method of claim 1, wherein the solution includes an amine.

6. The method of claim 1, further including degassing the solution.

7. The method of claim 1, further including growing the core-shell nanorod at a temperature of no higher than 310° C.

8. The method of claim 1, wherein the slow-injection rate of M2 precursor is less than 0.4 mmol per hour.

9. The method of claim 1, wherein the slow-injection rate of X2 precursor is less than 0.4 mmol per hour.

10. The method of claim 1, wherein the M2 precursor solution includes 1-octadecene.

11. The method of claim 1, wherein the X2 precursor solution includes 1-octadecene.

12. The method of claim 1, wherein concentration of the M2 precursor is between 0.05 M-0.20 M.

13. The method of claim 1, wherein concentration of the X2 precursor is between 0.07 M-0.30 M.

* * * * *